United States Patent
Yang et al.

(10) Patent No.: US 11,884,855 B2
(45) Date of Patent: Jan. 30, 2024

(54) SYNTHESIS OF EUROPIUM HALIDE PEROVSKITES IN SOLUTION PHASE

(71) Applicant: The Regents of the University of California, Oakland, CA (US)

(72) Inventors: Peidong Yang, Berkeley, CA (US); Jianmei Huang, Berkeley, CA (US); Teng Lei, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 83 days.

(21) Appl. No.: 17/625,196

(22) PCT Filed: Jun. 29, 2020

(86) PCT No.: PCT/US2020/040098
§ 371 (c)(1),
(2) Date: Jan. 6, 2022

(87) PCT Pub. No.: WO2021/007060
PCT Pub. Date: Jan. 14, 2021

(65) Prior Publication Data
US 2022/0259497 A1    Aug. 18, 2022

Related U.S. Application Data

(60) Provisional application No. 62/871,528, filed on Jul. 8, 2019.

(51) Int. Cl.
*C09K 11/77* (2006.01)
*C01F 17/36* (2020.01)
(Continued)

(52) U.S. Cl.
CPC .......... *C09K 11/7733* (2013.01); *C01F 17/36* (2020.01); *C08K 9/04* (2013.01);
(Continued)

(58) Field of Classification Search
CPC .......................... C09K 11/7733; C01F 17/36
See application file for complete search history.

(56) References Cited

U.S. PATENT DOCUMENTS

| 2017/0358757 | A1 | 12/2017 | Lee et al. | |
| 2018/0047928 | A1* | 2/2018 | Kim | ..................... H10K 50/125 |
| 2019/0267556 | A1* | 8/2019 | Kim | ................... H10K 85/6574 |

FOREIGN PATENT DOCUMENTS

EP    3 258 495 A1    12/2017

OTHER PUBLICATIONS

Moon et al., "Rare-Earth-Element-Ytterbium-Substituted Lead-Free Inorganic Perovskite Nanocrystals for Optoelectronic Applications", Adv. Mater., 2019, 31, 1901716, pp. 1-7, Jun. 23, 2019.*

(Continued)

*Primary Examiner* — C Melissa Koslow
(74) *Attorney, Agent, or Firm* — Foley & Lardner LLP

(57) ABSTRACT

A solution phase synthesis process for preparing a rare earth perovskite, the process includes reacting an alkali metal material with a first surfactant ligand in the presence of a first solvent to obtain a first precursor complex solution; reacting a rare earth metal halide with a second surfactant ligand in the presence of a second solvent to obtain a second precursor complex solution; and reacting the first precursor complex solution with the second precursor complex solution in the presence of a third surfactant ligand and a third solvent to obtain the rare earth perovskite; wherein: the rare (Continued)

earth perovskite is in the form of nanocrystals; and the first solvent and third solvent comprise a non-coordinating solvent.

15 Claims, 17 Drawing Sheets

(51) Int. Cl.
    *C08K 9/04*     (2006.01)
    *C09K 11/02*     (2006.01)
    *C30B 7/14*     (2006.01)
    *C30B 29/02*     (2006.01)
    *C30B 29/12*     (2006.01)

(52) U.S. Cl.
    CPC .............. *C09K 11/025* (2013.01); *C30B 7/14* (2013.01); *C30B 29/12* (2013.01); *C01P 2002/34* (2013.01); *C01P 2002/60* (2013.01); *C01P 2002/72* (2013.01); *C01P 2002/74* (2013.01); *C01P 2002/77* (2013.01); *C01P 2002/85* (2013.01); *C01P 2004/04* (2013.01)

(56) References Cited

OTHER PUBLICATIONS

Byung Joon Moon et al: "Rare-Earth-Element-Ytterbium Substituted Lead-Free Inorganic Perovskite Nanocrystals for Optoelectronic Applications", Advanced Materials, vol. 31, No. 33, Jun. 23, 2019 (Jun. 23, 2019), p. 1901716, XP055727123, ISSN: 0935-9648, DOI: 10.1002/adma.201901716.

D.G. Nocera et al: "Preparation, crystal structure, and enthalpy of formation of cesium europium(!!) chloride, CsEuCI3", Journal of Inorganic and Nuclear Chemistry, vol. 42, No. 1, Jan. 1, 1980 (Jan. 1, 1980), pp. 55-59, XP055727656, ISSN: 0022-1902, DOI: 10.1016/0022-1902(80)80043-1 the whole document.

Gerd Meyer: "The Reduction of Rare-Earth Metal Halides with Unlike Metals—Wöhler's Metallothermic Reduction", Z. Anorg. Allg. Chem., vol. 633, Jan. 1, 2007 (Jan. 1, 2007), pp. 2537-2552, XP055001195, figure 5.

International Preliminary Report on Patentability for PCT/US2020/040098 dated Jan. 20, 2022, 14 pages.

International Search Report and Written Opinion for PCT/US2020/040098 dated Nov. 4, 2020, 23 pages.

\* cited by examiner (1) EuCl$_3$ + OlAm → EuCl$_2$ + OlAmCl (2) EuCl$_2$ + Cs-oleate → CsEuCl$_3$

FIB. 1B

SYNTHESIS OF EUROPIUM HALIDE PEROVSKITES IN SOLUTION PHASE

CROSS-REFERENCE TO RELATED APPLICATIONS

This application is a national stage application under 35 U.S.C. § 371 of International Application No. PCT/US2020/040098, filed on Jun. 29, 2020, which claims the benefit of and priority to U.S. patent application Ser. No. 62/871,528, filed on Jul. 8, 2019, the contents of each of which are incorporated herein by reference in their entirety.

FIELD

The present technology is generally related to a process for preparing a lead-free perovskite, and, more particularly, to rare earth metal perovskites. The present technology also relates to compositions and applications that include a rare earth metal perovskite.

BACKGROUND

Lead halide perovskites of formula $APbX_3$, where A is $CH_3NH_3^+$ or $Cs^+$, and X is a halide, show great promise as semiconductor materials for highly efficient photovoltaics and color-tunable light emitting diodes (LEDs). The performance of such materials is on par with single crystalline silicon/GaN technology. In addition, their cost of fabrication is greatly reduced due to their room temperature, and solution-processable nature. However, the intrinsic toxicity of lead is a primary concern for the commercialization of this technology. Lead-free halide perovskite semiconducting materials with comparable optical and electronic properties are of great interest. Rare earth halide perovskites that exhibit a strong photoluminescence, have been synthesized using solid-state methods. However, crystals grown using the solid-state methods cannot be dissolved without decomposition.

Thus, there is a continuing need for solution methods for synthesizing rare earth halide perovskites, allowing for more options for the fabrication of optoelectronic devices.

SUMMARY

In one aspect, the present technology provides a solution phase process for preparing rare earth perovskite nanocrystals. The process includes reacting an alkali metal material with a first surfactant ligand in the presence of a first solvent to obtain a first precursor complex solution; reacting a rare earth metal halide with a second surfactant ligand in the presence of a second solvent to obtain a second precursor complex solution; and reacting the first precursor complex solution with the second precursor complex solution in the presence of a third surfactant ligand and a third solvent to obtain the rare earth perovskite; wherein the rare earth perovskite is in the form of nanocrystals; and the first solvent and third solvent comprise a non-coordinating solvent.

In another aspect, the present technology provides a solution phase process for preparing rare earth perovskite nanocrystals that includes reacting an alkali metal material and a rare earth metal halide having the formula $EX_3$ with one or more surfactant ligands and one or more solvents to obtain the rare earth perovskite, wherein E is a rare earth metal as described herein in any embodiment and X is F, Cl, Br, or I, and the rare earth metal perovskite is in the form of nanocrystals.

In another aspect, the present technology provides a crystalline compound having a perovskite structure and a rare earth metal, where the crystalline compound has the crystalline compound has a uniform size distribution from about 5 nm to about 50 nm, and where the crystalline compound is prepared according to a process as described herein in any embodiment.

In another related aspect, the present technology provides a light emitting diode (LED) that includes a crystalline compound having a perovskite structure and a rare earth element.

In a further related aspect, the present technology provides a solar cell comprising a crystalline compound having a perovskite structure and a rare earth element.

In yet another related aspect, the present technology provides a photodetector comprising a crystalline compound having a perovskite structure and a rare earth element.

BRIEF DESCRIPTION OF THE DRAWINGS

FIG. 1B illustrates a scheme of extended unit cell of $CsEuCl_3$ perovskite nanocrystals.

DETAILED DESCRIPTION

Figure 1A:
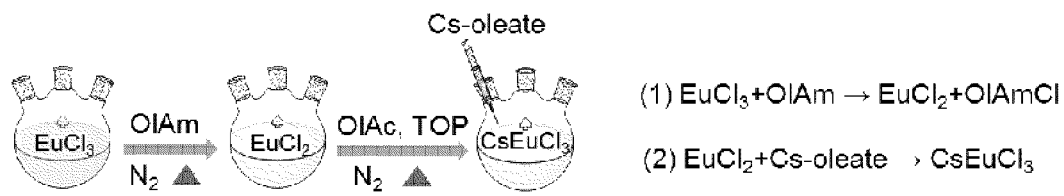
FIG. 1A illustrates a schematic of synthesis and reactions for preparation of $CsEuCl_3$ perovskite nanocrystals.
Figure 1A:
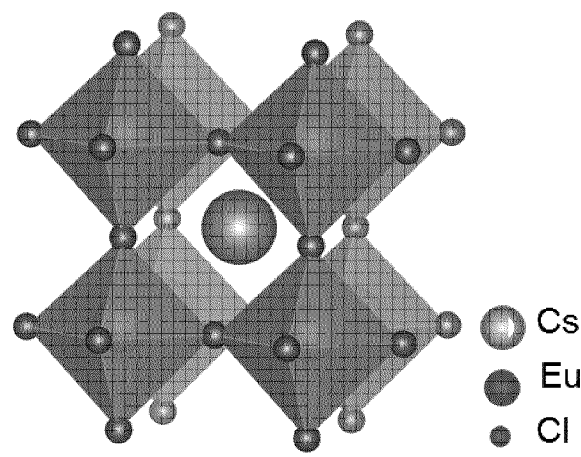

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s).

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

The use of the terms "a" and "an" and "the" and similar referents in the context of describing the elements (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential.

Reference to an "alkali metal material" means a material that includes an alkali metal.

Provided herein is a solution phase synthesis process for producing single-crystal rare earth metal perovskite nanocrystals. In addition, provided herein are compositions and applications that include rare earth metal perovskites, and in particular, single-crystal rare earth metal perovskite nanocrystals obtained according to the synthesis process described herein. Illustrative rare earth metal perovskites are inorganic compounds having the formula MEX$_3$, where M is an alkali metal, E is a rare earth metal, and X is a halide. In some embodiments, M is cesium, E is europium, and X is chloride. While efforts have been made to improve lead perovskites by replacing the organic A site cation with an inorganic cation such Cs$^+$ or Rb$^+$, the toxicity of lead is still a main concern for various applications such as photovoltaics and color-tunable light emitting diodes (LEDs).

Rare earth halide perovskites are promising candidates for lead-free halide perovskite due to their strong photoluminescence. The reported hybrid europium halide perovskite (C$_4$H$_9$NH$_3$)$_2$EuI$_4$ bulk crystal and the all inorganic CsEuBr$_3$ bulk crystal show strong blue emission, which indicates that europium halide perovskites are promising for use as a blue LED. However, the reported europium halide perovskites were synthesized by solid-state method. Solution synthesis of rare earth perovskite is challenging due to the difficulties in choosing the appropriate precursors to dissolve in solvent.

A solution phase synthesis process for preparing single-crystal rare earth metal perovskite nanocrystals has now been discovered. The single-crystal rate earth metal perovskite nanocrystals may have a uniform size distribution centered around 15 nm. Surprisingly, the exemplary CsEuCl$_3$ nanocrystals exhibit a blue emission at about 435 nm, with a narrow full width at half maximum (FWHM) of about 19 nm. These CsEuCl$_3$ nanocrystals may be embedded in a poly(methylmethacrylate) polymer matrix, which provides enhanced stability under irradiation by a continuous laser. The lead-free, PMMA-encapsulated, CsEuX$_3$ nanocrystals, are a promising candidate to replace lead halide perovskites.

In one aspect, the present technology provides a solution phase synthesis process for preparing rare earth perovskite nanocrystals. The process includes reacting an alkali metal material with a first surfactant ligand in the presence of a first solvent to obtain a first precursor complex solution; reacting a rare earth metal halide with a second surfactant ligand in the presence of a second solvent to obtain a second precursor complex solution; and reacting the first precursor complex solution with the second precursor complex solution in the presence of a third surfactant ligand and a third solvent to obtain the rare earth perovskite; wherein the rare earth perovskite is in the form of nanocrystals; and the first solvent and third solvent comprise a non-coordinating solvent.

In any embodiment, the alkali metal material may be an alkali metal carbonate, alkali metal acetate, or a combination thereof. In any embodiment, the alkali metal of the alkali metal material may be lithium (Li), sodium (Na), potassium (K), rubidium (Rb), cesium (Cs), or a mixture of any two or more thereof. In any embodiment herein, the alkali metal of the alkali metal material may be cesium. In any embodiment herein, the alkali metal of the alkali metal material may be rubidium.

In any embodiment, the first surfactant ligand, second surfactant ligand, or third surfactant ligand may be oleic acid, dodecanoic acid, octanoic acid, heptadecanoic acid, oleyl amine, dodecylamine, trioctylamine, trioctyl phosphine, triphenylphosphine, or a combination of any two or more thereof. For example, in any embodiment, the first surfactant ligand, second surfactant ligand, or third surfactant ligand may include one or more of oleic acid, oleyl amine, or trioctyl phosphine. In any embodiment, the first surfactant ligand may be oleic acid. In any embodiment, the second surfactant ligand may be oleyl amine. In any embodiment, the third surfactant ligand may be a mixture of oleic acid and trioctyl phosphine. In any embodiment, the first precursor complex solution comprises a complex of a cation of the alkali metal and an anion of the first surfactant ligand.

In any embodiment, the rare earth metal halide may include cerium (Ce), erbium (Er), europium (Eu), gadolinium (Gd), holmium (Ho), lanthanum (La), lutetium (Lu), neodymium (Nd), praseodymium (Pr), promethium (Pm), samarium (Sm), terbium (Tb), thulium (Tm), ytterbium (Yb), or a combination of any two or more thereof. In some embodiments, the rare earth metal may be europium.

When the rare earth metal halide is reacted with the second surfactant ligand, the second precursor complex forms. Here, the rare earth metal halide (e.g., $EX_3$) prior to reaction with the second surfactant ligand may include the rare earth metal in the form of a trivalent metal ion $E^{3+}$ (where $E^{3+}$ is a trivalent cation of the rare earth metal), which upon reaction with the second surfactant ligand reduces the rare earth metal to a divalent metal (e.g., $E^{2+}$). In any embodiment, the second precursor complex may have a formula: $EX_2$-LX, wherein E is a rare earth metal, L is the second surfactant ligand, and X is F, Cl, Br, or I. For example, the second surfactant ligand L may be oleyl amine. In any embodiment, the rare earth metal E may be europium. In any embodiment, X may be Cl.

Following formation of the second precursor complex, the first and second precursor complexes are combined and reacted to form the rare earth perovskite. The rare earth perovskite may have the formula: $MEX_3$, where M may be an alkali metal, E may be a rare earth metal, and X may be F, Cl, Br, or I. In any embodiment, the alkali metal (M) may be cesium. In any embodiment, the rare earth metal (E) may be europium. In any embodiment, the halide (X) may be Cl.

As described herein in any embodiment, the process is a solution phase synthetic process. In each reacting step described herein, the process may be carried out in the presence of a non-coordinating solvent. For example, the non-coordinating solvent may be a long chain olefin having a boiling point above 250° C. Suitable non-coordinating solvents include octadecene, octadecane, hexadecane, or a combination of two or more thereof. As used herein, the term "non-coordinating solvent" refers to solvents that have no, or substantially no, interaction with metal cations present in solution, and in particular, do not form complexes with metal cations.

In any embodiment herein, the rare earth perovskite may be in the form of single-crystalline nanocrystals or polycrystalline nanocrystals. In any embodiment herein, the rare earth perovskite may be in the form of single-crystalline nanocrystals. The nanocrystals of the rare earth metal perovskite may have a uniform size distribution from about 5 nm to about 50 nm. For example, in any embodiment herein, the uniform size distribution may be about 5 nm, about 10 nm, about 15 nm, about 20 nm, about 25 nm, about 30 nm, about 35 nm, about 40 nm, about 45 nm, about 50 nm, or any range including and/or in between any two of the preceding values. In any embodiment, the uniform size distribution may be from about 5 nm to about 35 nm or from about 10 nm to about 20 nm. In any embodiment herein, the rare earth perovskite may be in the form of polycrystalline nanocrystals.

To improve various properties and the stability of the rare earth perovskite, the process may include additional treatment steps. In any embodiment, the process may further include surface treating the rare earth perovskite. For example, the surface treating step may include combining the rare earth perovskite with a halide-providing compound. In any embodiment, the halide-providing compound may be a quaternary ammonium halide compound, benzoyl halide, pyridinium halide, or a combination of two or more thereof. In any embodiment herein, the quaternary ammonium halide may include a linear or branched alkyl or alkenyl ammonium halide (e.g., oleyl ammonium halide, octyl ammonium halide, butyl ammonium halide, tetra-n-butyl ammonium halide, tetra-n-octyl ammonium halide). For example, the halide-providing compound may be a butyl methylpyridinium halide, a tetra-n-butylammonium halide, a tetra-n-octylamonium halide, or a combination of two or more thereof.

Figure 7:
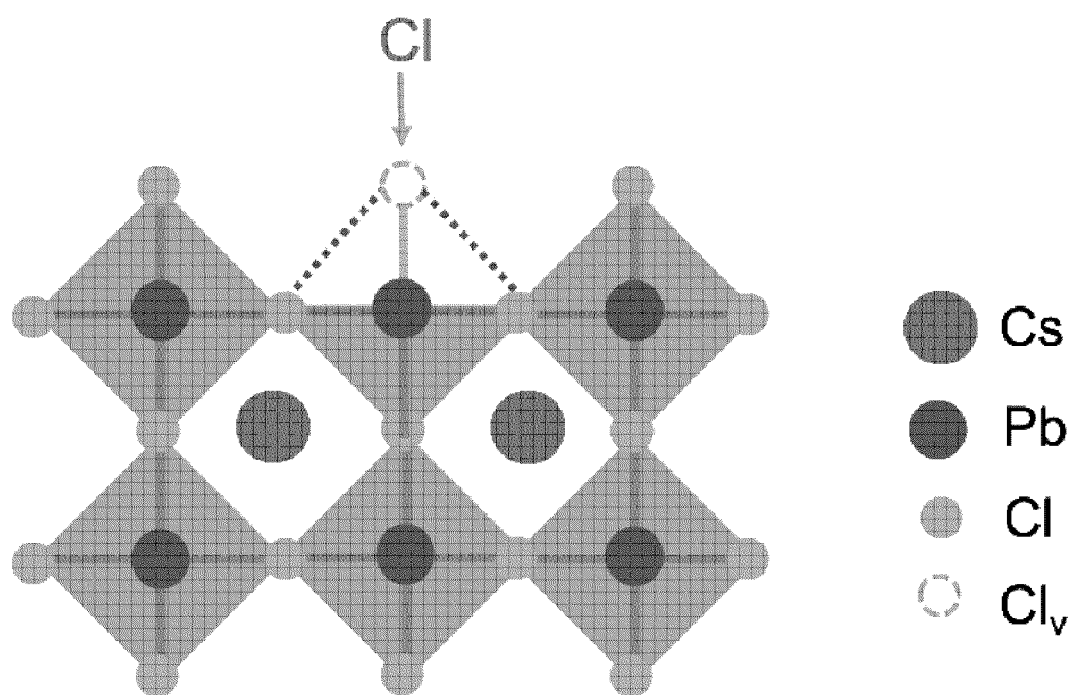
FIG. 7 illustrates a schematic representation of surface treatment with 1-butyl-4-methylpyridinium chloride providing the chloride source to substitute the chloride vacancy (Cl$_v$) in the nanocrystal surface.

Surface treatment of the rare earth perovskite prepared according to the present technology increases the photoluminescence quantum efficiency. Without being bound by theory, it is believed the increase in photoluminescence quantum efficiency is due to the halide-providing compound substituting halide vacancies in the rare earth metal perovskite surface (FIG. 7).

The process may further include encapsulating the rare earth perovskite in a polymer. Suitable polymers may include, but are not limited to, poly(methylmethacrylate) (PMMA), poly(styrene-ethylene-butylene-styrene), poly(lauryl methacrylate), poly(acrylic acid), or a combination or two or more thereof. In any embodiment, the polymer may be PMMA.

In another aspect, the present technology provides a solution phase synthesis process for preparing rare earth perovskite nanocrystals. The process includes reacting a first surfactant ligand in the presence of a first solvent to obtain a precursor complex solution; and reacting the precursor complex solution and a rare earth metal halide having the formula $EX_3$ with one or more additional surfactant ligands and one or more additional solvents to obtain the rare earth perovskite, wherein E is a rare earth metal as described herein in any embodiment and X is F, Cl, Br, or I, and the rare earth metal perovskite is in the form of nanocrystals.

In any embodiment herein, the alkali metal material may be an alkali metal carbonate, alkali metal acetate, or a combination thereof. In any embodiment, the alkali metal of the alkali metal material may be lithium (Li), sodium (Na), potassium (K), rubidium (Rb), cesium (Cs), or a mixture of any two or more thereof. In any embodiment herein, the alkali metal of the alkali metal material may be cesium. In any embodiment herein, the alkali metal of the alkali metal material may be rubidium.

In any embodiment, the rare earth metal halide ($EX_3$), wherein E may be cerium (Ce), erbium (Er), europium (Eu), gadolinium (Gd), holmium (Ho), lanthanum (La), lutetium (Lu), neodymium (Nd), praseodymium (Pr), promethium (Pm), samarium (Sm), terbium (Tb), thulium (Tm), ytterbium (Yb), or a combination of any two or more thereof. In any embodiment herein, the rare earth metal may be europium. In any embodiment herein, the rare earth metal may be rubidium. Here, the rare earth metal of the rare earth metal halide may be in the form of a trivalent cation ($E^{3+}$).

The rare earth perovskite may have the formula: $MEX_3$, where M may be an alkali metal, E may be a rare earth metal, and X may be F, Cl, Br, or I. In any embodiment herein, the alkali metal (M) may be cesium. In any embodiment, the rare earth metal (E) may be europium. In any embodiment, the halide (X) may be Cl.

In any embodiment, the first surfactant ligand may be oleic acid, dodecanoic acid, octanoic acid, heptadecanoic acid, oleyl amine, dodecylamine, trioctylamine, trioctyl phosphine, triphenylphosphine, or a combination of any two or more thereof. For example, in any embodiment, the first surfactant ligand may include one or more of oleic acid, oleyl amine, or trioctyl phosphine. In any embodiment, the first surfactant ligand may be oleic acid. In any embodiment, the first precursor complex solution comprises a complex of a cation of the alkali metal and an anion of the first surfactant ligand.

In any embodiment herein, the one or more additional surfactant ligands may be oleic acid, dodecanoic acid, octanoic acid, heptadecanoic acid, oleyl amine, dodecylamine, trioctylamine, trioctyl phosphine, triphenylphosphine, or a combination of any two or more thereof. In any embodiment herein, the one or more surfactant ligands may be oleic acid, oleyl amine, trioctyl phosphine, or a mixture thereof. For example, the reacting may take place in the presence of oleic acid, oleyl amine, and trioctyl phosphine.

In any embodiment, the first solvent and one or more additional solvents may be a long chain olefin having a boiling point above 250° C. For example, in any embodiment herein, the one or more solvents may be octadecene, octadecane, hexadecane, or the like, or a combination of any two or more thereof. In any embodiment, the solvent may be octadecene.

In any embodiment herein, the rare earth perovskite may be in the form of single-crystalline nanocrystals or polycrystalline nanocrystals. In any embodiment herein, the rare earth perovskite may be in the form of single-crystalline nanocrystals. The nanocrystals of the rare earth metal perovskite may have a uniform size distribution from about 5 nm to about 50 nm. For example, in any embodiment herein, the uniform size distribution may be about 5 nm, about 10 nm, about 15 nm, about 20 nm, about 25 nm, about 30 nm, about 35 nm, about 40 nm, about 45 nm, about 50 nm, or any range including and/or in between any two of the preceding values. In any embodiment, the uniform size distribution may be from about 5 nm to about 35 nm or from about 10 nm to about 20 nm. In any embodiment herein, the rare earth perovskite may be in the form of polycrystalline nanocrystals.

To improve various properties and the stability of the rare earth perovskite, the process may include additional treatment steps. In any embodiment, the process may further include surface treating the rare earth perovskite. For example, the surface treating step may include combining the rare earth perovskite with a halide-providing compound. In any embodiment, the halide-providing compound may be a quaternary ammonium halide compound, benzoyl halide, pyridinium halide, or a combination of two or more thereof. In any embodiment herein, the quaternary ammonium halide may include a linear or branched alkyl or alkenyl ammonium halide (e.g., oleyl ammonium halide, octyl ammonium halide, butyl ammonium halide, tetra-n-butyl ammonium halide, tetra-n-octyl ammonium halide). For example, the halide-providing compound may be a butyl methylpyridinium halide, a tetra-n-butylammonium halide, a tetra-n-octylamonium halide, or a combination of two or more thereof.

The process may further include encapsulating the rare earth perovskite in a polymer. Suitable polymers may include, but are not limited to, poly(methylmethacrylate) (PMMA), poly(styrene-ethylene-butylene-styrene), poly (lauryl methacrylate), poly(acrylic acid), or a combination or two or more thereof. In any embodiment, the polymer may be PMMA.

In another aspect, the present technology provides a crystalline compound having a perovskite structure and a rare earth metal, where the crystalline compound has the crystalline compound has a uniform size distribution from about 5 nm to about 50 nm, and where the crystalline compound is prepared according to a process as described herein in any embodiment.

In a related aspect, the present technology provides a rare earth containing composition that includes a rare earth perovskite encapsulated in a polymer matrix, where: the rare earth perovskite has a formula of $MEX_3$, where M is an alkali metal, E is a rare earth metal, and X is F, Cl, Br, or I; the rare earth perovskite is in the form of nanocrystals; and the composition exhibits an emission spectrum from about 400 nm to about 475 nm at an excitation wavelength from about 280 nm to about 460 nm.

In any embodiment, the alkali metal (M) may be cesium. In any embodiment, the rare earth metal (E) may be europium. In any embodiment, the halide (X) may be Cl.

In any embodiment, the nanocrystals of the rare earth containing composition may have a uniform size distribution from about 5 nm to about 50 nm. For example, in any embodiment herein, the uniform size distribution may be about 5 nm, about 10 nm, about 15 nm, about 20 nm, about 25 nm, about 30 nm, about 35 nm, about 40 nm, about 45 nm, about 50 nm, or any range including and/or in between any two of the preceding values. In any embodiment, the uniform size distribution may be from about 5 nm to about 35 nm or from about 10 nm to about 20 nm.

In any embodiment, the rare earth containing composition may exhibit an emission spectrum at about 435 nm at an excitation wavelength of about 350 nm, and having a full width at half maximum (FWHM) of from about 15 nm to about 35 nm. In any embodiment, the FWHM may be about 19 nm to about 20 nm.

In any embodiment, the polymer may be PMMA, poly (styrene-ethylene-butylene-styrene), poly(lauryl methacrylate), poly(acrylic acid), or a combination of two or more thereof. For example, in any embodiment, the polymer may be PMMA. In any embodiment, the rare earth containing composition may in the form of a thin film having a film thickness from about 100 nm to about 10 μm. For example, in any embodiment herein, the thin film may have a film thickness of about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm, about 1 μm, about 1.5 μm, about 2 μm, about 2.5 μm, about 3 μm, about 3.5 μm, about 4 μm, about 4.5 μm, about 5 μm, about 5.5 μm, about 6 μm, about 6.5 μm, about 7 μm, about 7.5 μm, about 8 μm, about 8.5 μm, about 9 μm, about 9.5 μm, about 10 μm, or any range including and/or in between any two of the preceding values.

In another related aspect, the present technology provides a light emitting diode (LED) that includes a crystalline compound having a perovskite structure and a rare earth element. In any embodiment, the crystalline compound may be obtained according to a process described herein in any embodiment. For example, in any embodiment, the crystalline compound may have a formula of MEX$_3$, where M is an alkali metal, E is a rare earth metal, and X is F, Cl, Br, or I. In any embodiment, the crystalline compound may be in the form of single-crystalline nanocrystals.

In any embodiment, the crystalline compound exhibits an emission spectrum from about 400 nm to about 475 nm at an excitation wavelength from about 280 nm to about 460 nm. For example, in any embodiment, the crystalline compound of the LED may exhibit an emission spectrum at about 435 nm and having a FWHM of from about 15 nm to about 35 nm. In any embodiment, the FWHM is about 19 nm to about 20 nm.

In a further related aspect, the present technology provides a solar cell comprising a crystalline compound having a perovskite structure and a rare earth element. In any embodiment, the crystalline compound may be obtained according to a process described herein in any embodiment. For example, in any embodiment, the crystalline compound may have a formula of MEX$_3$, where M is an alkali metal, E is a rare earth metal, and X is F, Cl, Br, or I. In any embodiment, the crystalline compound may be in the form of single-crystalline nanocrystals.

In any embodiment, the crystalline compound of the solar cell exhibits an emission spectrum from about 400 nm to about 475 nm at an excitation wavelength from about 280 nm to about 460 nm. For example, in any embodiment, the crystalline compound of the solar cell may exhibit an emission spectrum at about 435 nm at an excitation wavelength of about 350 nm and having a FWHM of from about 15 nm to about 35 nm. In any embodiment, the FWHM is about 19 nm to about 20 nm.

In yet another related aspect, the present technology provides a photodetector comprising a crystalline compound having a perovskite structure and a rare earth element. In any embodiment, the crystalline compound may be obtained according to a process described herein in any embodiment. For example, in any embodiment, the crystalline compound may have a formula of MEX$_3$, where M is an alkali metal, E is a rare earth metal, and X is F, Cl, Br, or I. In any embodiment, the crystalline compound may be in the form of single-crystalline nanocrystals.

In any embodiment, the crystalline compound exhibits an emission spectrum from about 400 nm to about 475 nm at an excitation wavelength from about 280 nm to about 460 nm. For example, in any embodiment, the crystalline compound of the LED may exhibit an emission spectrum at about 435 nm at an excitation wavelength of about 350 nm and having a FWHM of from about 15 nm to about 35 nm. In any embodiment, the FWHM is about 19 nm to about 20 nm.

The present invention, thus generally described, will be understood more readily by reference to the following examples, which are provided by way of illustration and are not intended to be limiting of the present invention.

EXAMPLES

Example 1. Preparation of CsEuCl$_3$ Nanocrystals

Chemicals: Cs$_2$CO$_3$ (99.9%, Aldrich), EuCl$_3$ (99.99%, Alfa Aesar), 1-octadecene (ODE, 90%, Aldrich), oleic acid (OlAc, 90%, Aldrich), oleylamine (OlAm, Aldrich, 70%), trioctylphosphine (TOP, 97%, Aldrich), 1-butyl-4-methylpyridinium chloride (≥97%, Aldrich), poly(methyl methacrylate) (PMMA, Sigma-Aldrich), hexane (anhydrous, 95%, Aldrich), toluene (anhydrous, 99.8%, Aldrich). All chemicals were used as received without further purification.

Preparation of Cs-oleate solution: Cs$_2$CO$_3$ (0.2 g) and OlAc (0.7 mL) were loaded into a 3-neck flask along with ODE (7.5 mL), degassed and dried under vacuum at 120° C. for 30 min, and then heated under N$_2$ to 150° C. until all Cs$_2$CO$_3$ reacted with OlAc.

Synthesis of CsEuCl$_3$ nanocrystals: To prepare the stock solution, EuCl$_3$ (1 mmol) and OlAm (5 mL) were loaded into a 3-neck flask and degassed under vacuum for 60 min at 120° C. The temperature was then raised to 300° C. under N$_2$ and kept for 30 min to reduce the europium precursor. The stock solution was cooled down by air to room temperature and then transferred to the glove box for further use. ODE (5 mL), OlAc (0.25 mL), and TOP (0.5 mL) were loaded into a 3-neck flask and degassed under vacuum for 60 min at 120° C. Then 2 mL of the stock solution was injected under N$_2$ and temperature was raised to 250° C. and kept for 25 minutes. Cs-oleate solution (1 mL, prepared as described above) was swiftly injected (FIG. 1A). After 45 minutes, the reaction was quenched by cooling the flask in an ice-water bath. 6 ml of hexane was added into the obtained crude solution, and the nanocrystals were isolated by centrifugation at 8000 rpm for 5 min and washed once with hexane. The obtained precipitated nanocrystals were re-dispersed in hexane and centrifuged at 4000 rpm for 1 min to discard the aggregated nanocrystals and keep the supernatant monodispersed nanocrystals for further use.

Figure 1C:
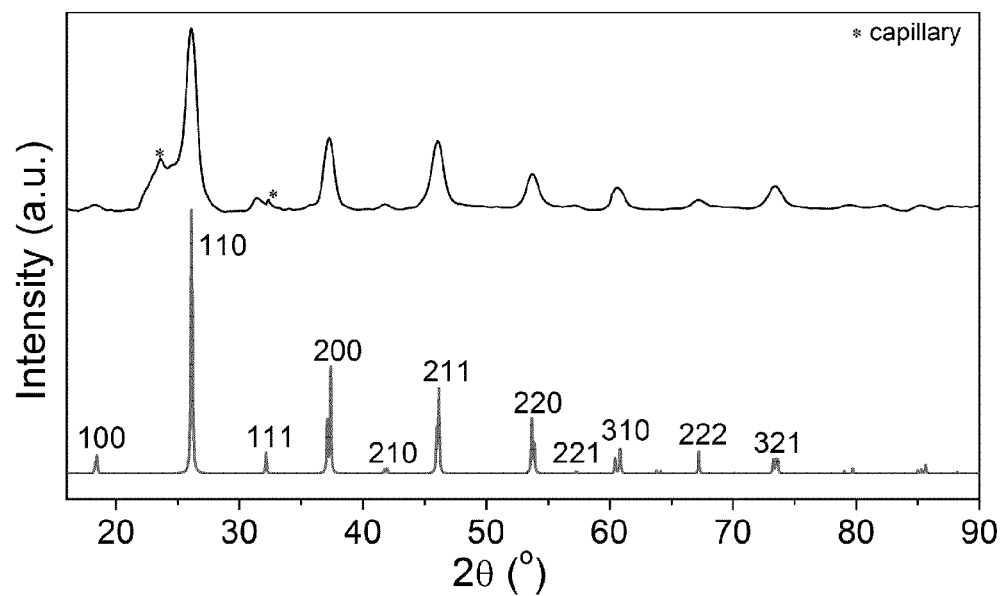
FIG. 1C illustrates a XRD pattern of $CsEuCl_3$ perovskite nanocrystals (top) and standard XRD pattern of $CsEuCl_3$ single crystal (bottom) using a X-ray with wavelength $\lambda=1.79$ Å.

Powder diffraction data for sample of CsEuCl$_3$ nanocrystals prepared according to the synthesis above was collected at a wavelength of 1.79 Å. The nanocrystals were loaded in a glass capillary. The structure of these nanocrystals was confirmed by XRD, which matched well with the standard pattern of CsEuCl$_3$ (FIGS. 1B and 1C).

Figure 2A:
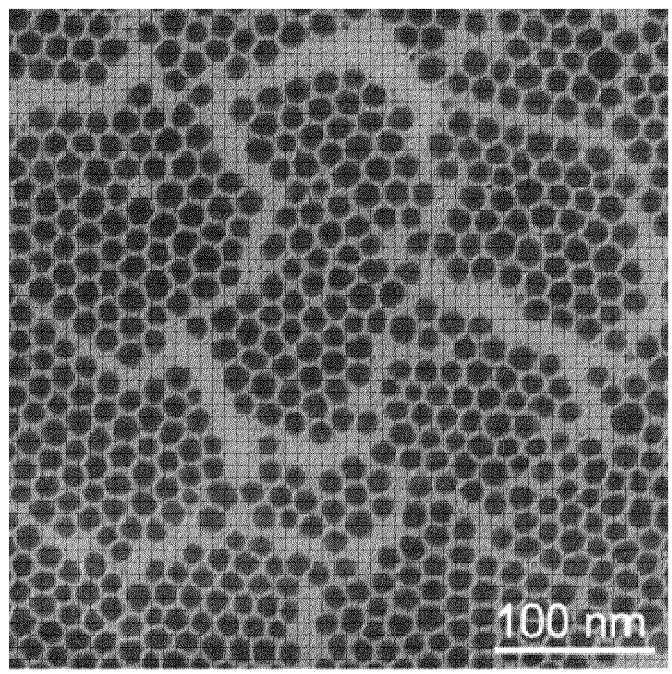
FIG. 2A illustrates a representative low-magnification Transmission Electron Microscopy (TEM) image of $CsEuCl_3$ perovskite nanocrystals.
Figure 2B:
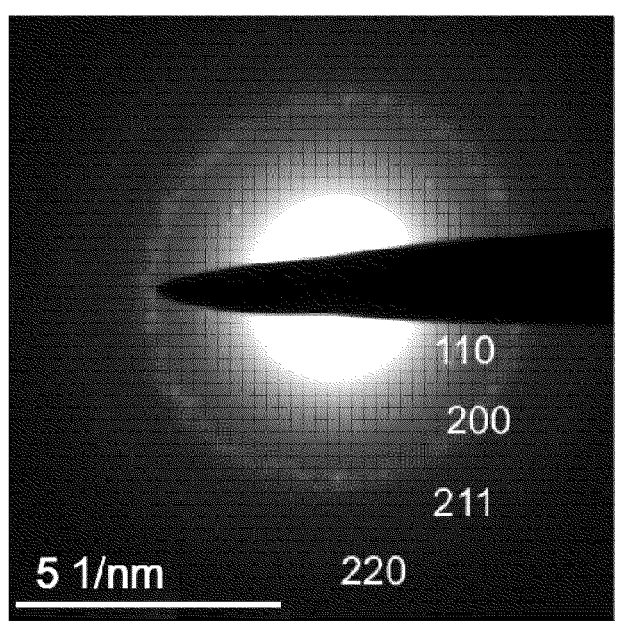
FIG. 2B illustrates a phase pattern of $CsEuCl_3$ perovskite nanocrystals and characterized using Selected Area Electron Diffraction (SAED).
Figure 2C:
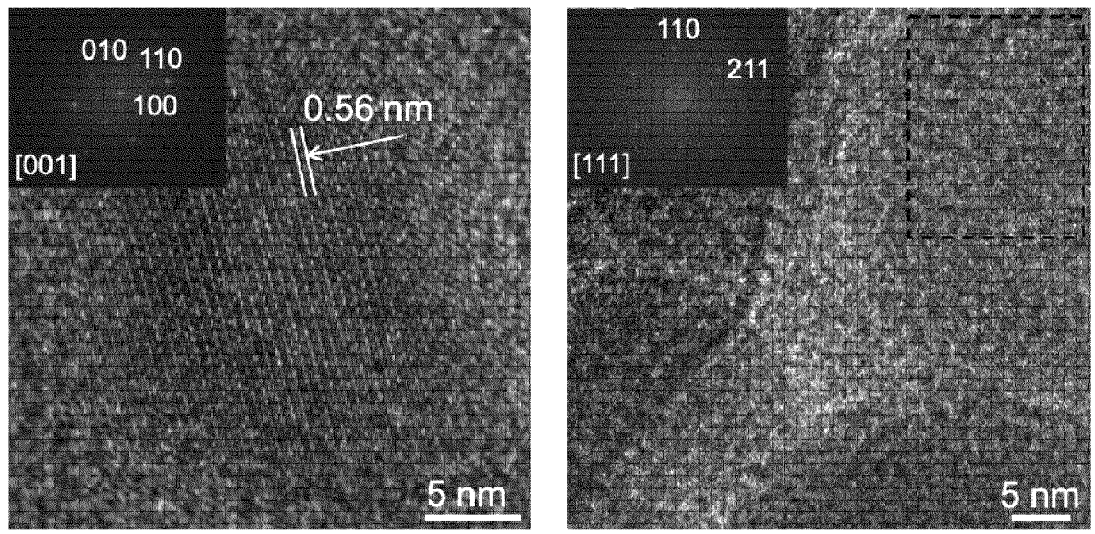
FIG. 2C illustrates High Resolution TEM (HRTEM) and corresponding Fast Fourier Transform (FFT) (inset) images showing single-crystalline structure of $CsEuCl_3$ perovskite.
Figure 2D:
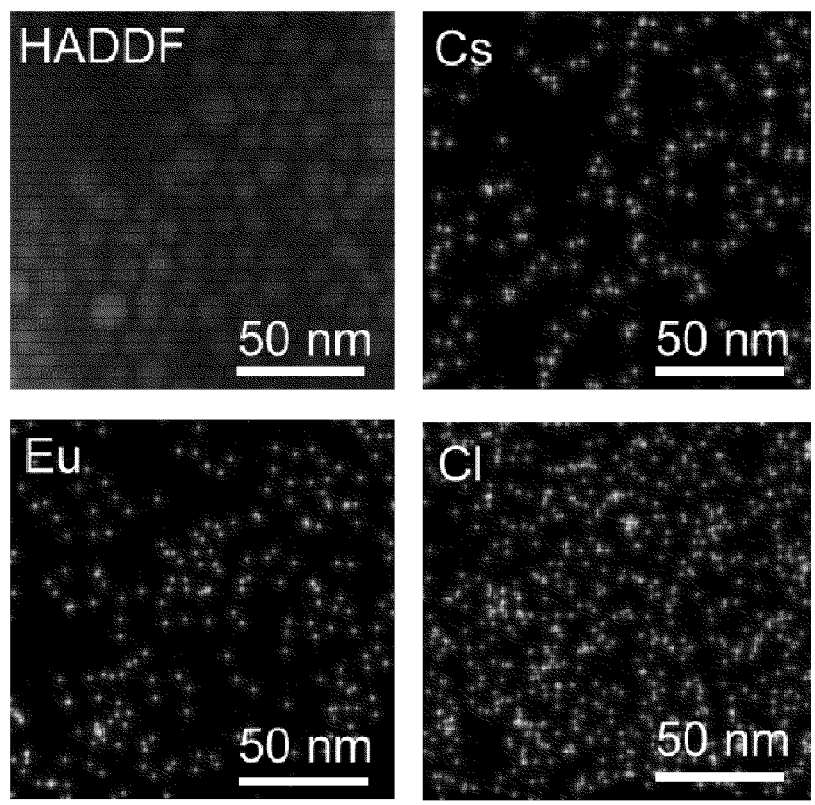
FIG. 2D illustrates Energy Dispersive Spectroscopy (EDS) mapping of $CsEuCl_3$ perovskite nanocrystals.
Figure 3:
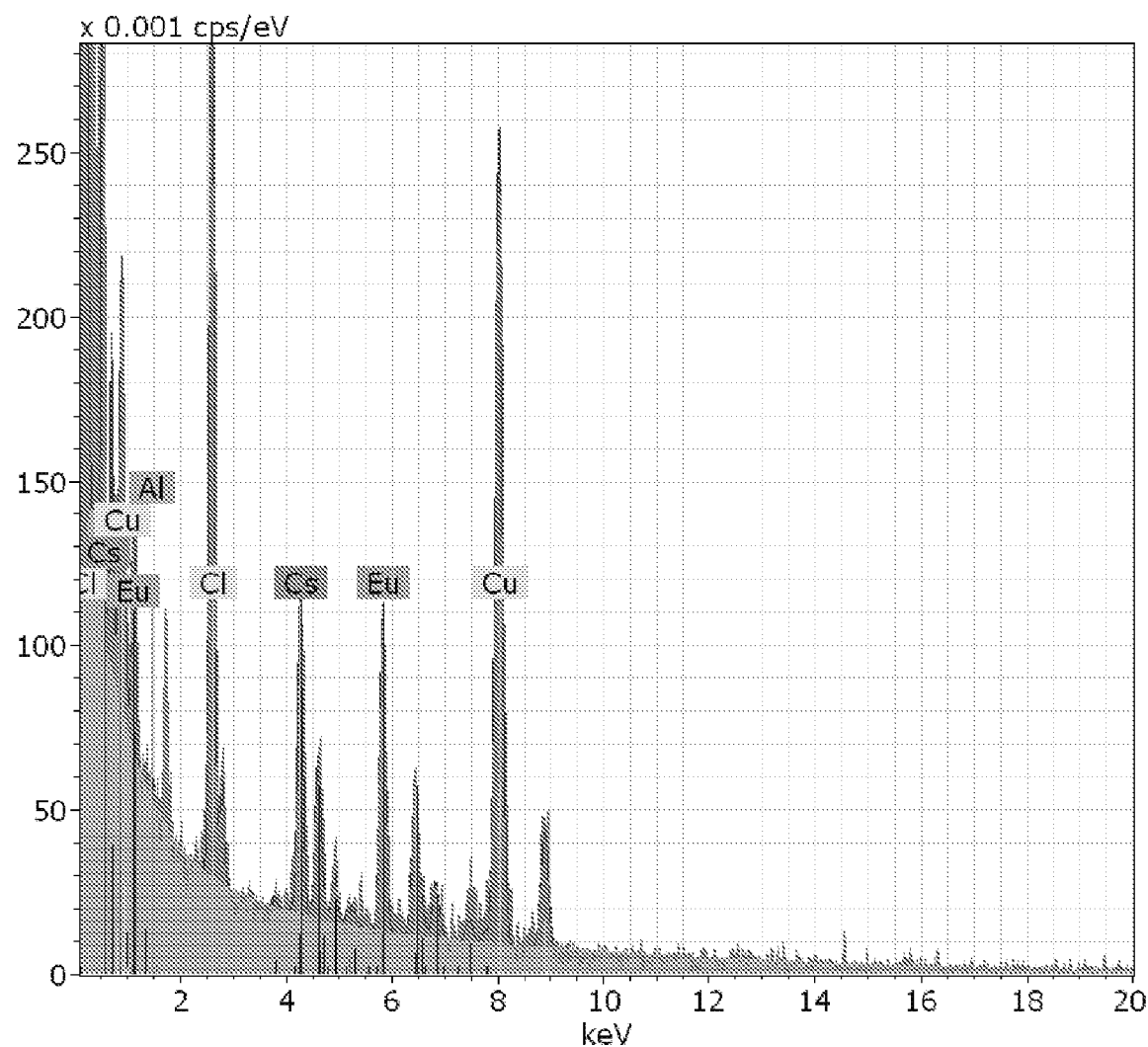
FIG. 3 illustrates an EDS spectrum of $CsEuCl_3$ perovskite nanocrystals.

Transmission Electron Microscopy (TEM) characterization was carried out to study the morphology, phase, and composition of the CsEuCl$_3$ nanocrystals. TEM image shows that the obtained CsEuCl$_3$ nanocrystals are around 15 nm in diameter (FIG. 2A). The phase of the CsEuCl$_3$ nanocrystals was further characterized from Selected Area Electron Diffraction (SAED), and the result shows clear diffraction rings from the (110), (200), (211) and (220) crystal planes of the CsEuCl$_3$ tetragonal phase, which is consistent with the XRD result (FIG. 2B). It is clear from that the CsEuCl$_3$ nanocrystals are single-crystalline from High Resolution TEM (HRTEM) image and corresponding Fast Fourier Transform (FFT) (FIG. 2C). A lattice constant of 0.56 nm is consistent with the (100) plane of CsEuCl$_3$. Energy Dispersive Spectroscopy (EDS) mapping of the CsEuCl$_3$ perovskite nanocrystals shows uniform distribution of Cs, Eu and Cl in the CsEuCl$_3$ nanocrystals, and EDS quantification shows a composition ratio of 18.4:20.2:61.4, close to 1:1:3 (FIGS. 2D and 3, Table 1).

TABLE 1

EDS measured atomic ratio of CsEuCl$_3$ nanocrystals.

| Elements | Stoichiometric Atomic % | Measured Atomic % |
|---|---|---|
| Cs | 20 | 18.4 |
| Eu | 20 | 20.2 |
| Cl | 60 | 61.4 |

Absorption spectra were collected using a Shimadzu UV-2600 PC UV-VIS-IR Scanning spectrophotometer equipped with a Shimadzu ISR-3100 integrating sphere. Solution Photoluminescent (PL) and Time-Resolved PL (TRPL) spectra were measured using a PicoQuant Fluotime 300, equipped with a PMA 175 detector and a LDH-P-C-405 diode laser with an excitation wavelength of 407.1 nm. Photoluminescent PL Excitation (PLE) were measured using a PicoQuant FluoTime 300 Fluorimeter. The sample was excited using a Xenon lamp and the emission at 435 nm was collected using a monochrometer with a bandpass filter to block excitation scatter.

Figure 4A:
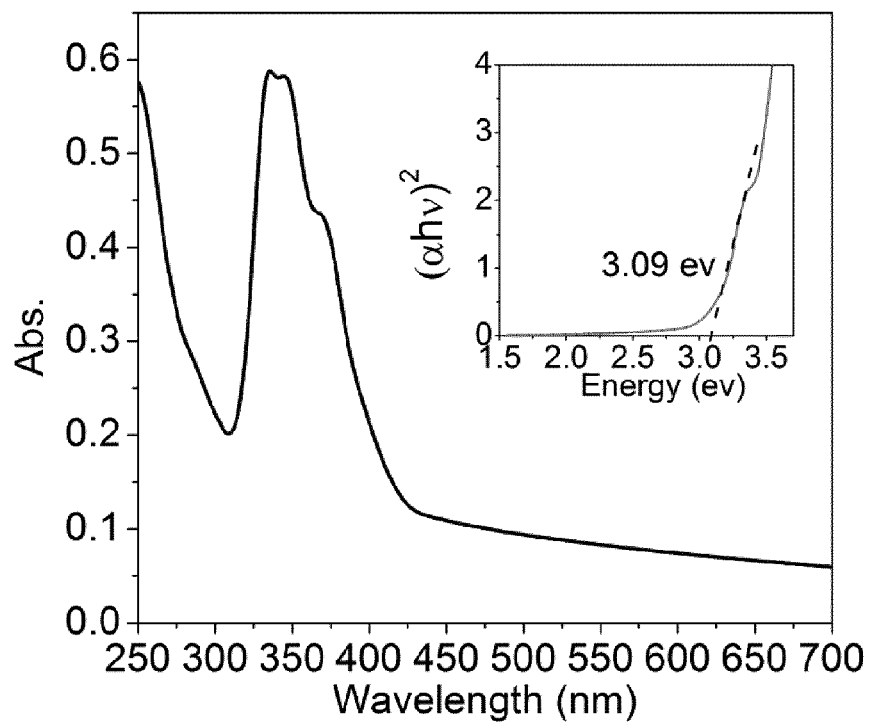
FIG. 4A illustrates an optical absorption and Tauc plot (inset) of absorption measurements of $CsEuCl_3$ perovskite nanocrystals.
Figure 4B:
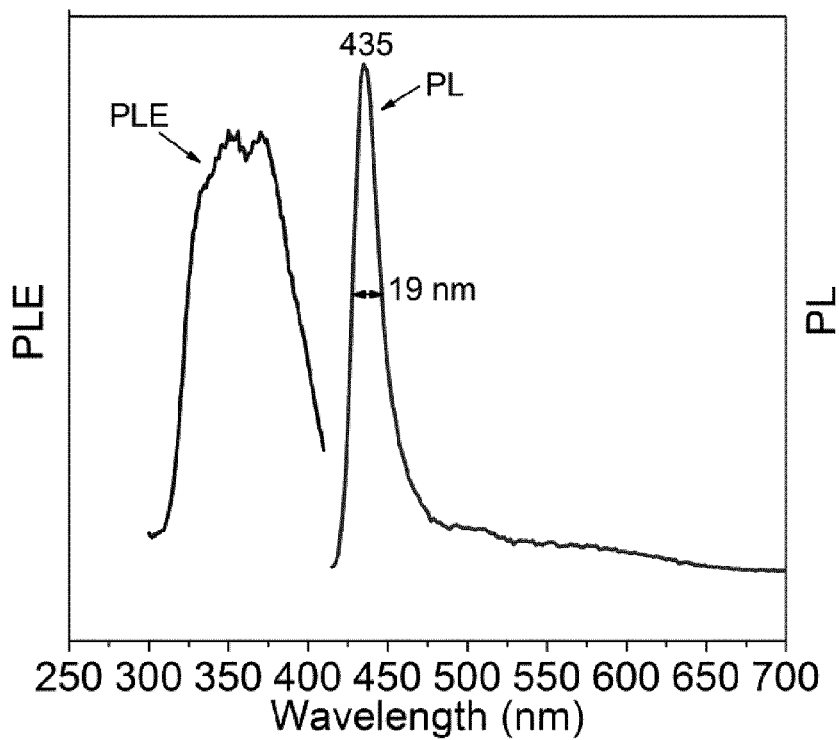
FIG. 4B illustrates a photoluminescence (PL) emission and PL excitation spectra collected at 435 nm for $CsEuCl_3$ perovskite nanocrystals prepared according to the present technology.
Figure 4C:
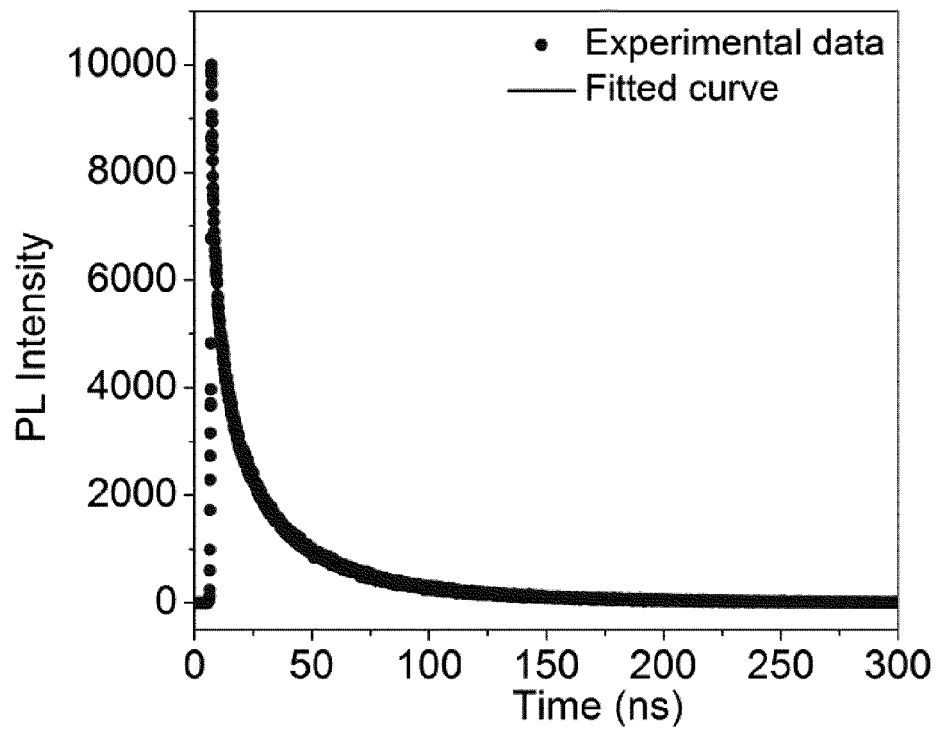
FIG. 4C illustrates a time-resolved photoluminescence spectra measurement showing the decay of photoluminescence at 435 nm for $CsEuCl_3$ perovskite nanocrystals.
Figure 4D:
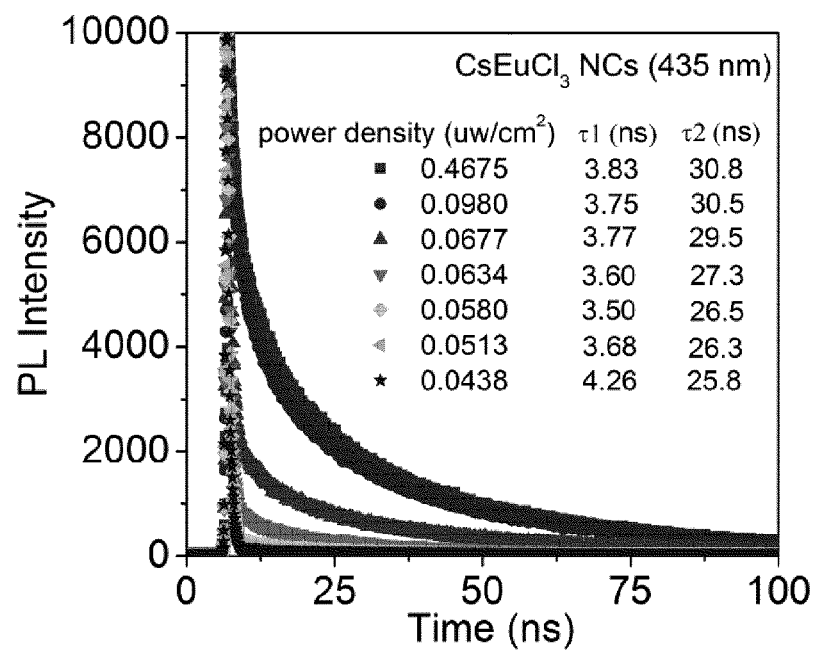
FIG. 4D illustrates a power dependent time-resolved photoluminescence spectra measured the photoluminescence decay at 435 nm for $CsEuCl_3$ perovskite nanocrystals.

CsEuCl$_3$ nanocrystals show a strong excitonic absorption at around 350 nm. The band gap was estimated to be 3.09 eV from the Tauc plot (FIG. 4A). The monodispersed colloidal nanocrystals show a blue emission centered at 435 nm with a narrow FWHM of 19 nm (FIG. 4B). Photoluminescence excitation (PLE) measurements were conducted at 435 nm emission wavelength, to confirm the origin of light emission from the absorption band edge. The PLE spectrum is consistent with the absorption peak at 350 nm, further demonstrating that light emitted is from the band edge. The photoluminescence quantum efficiency of colloidal nanocrystals exhibits 2%±0.3% at room temperature. To determine the lifetime of photogenerated carriers in CsEuCl$_3$ nanocrystals, the time-resolved PL (TRPL) was conducted at wavelength of 435 nm at room temperature, and fitted into a biexponential decay function. The first component with a fast decay lifetime of 4.4 ns corresponds to surface site non-radiative recombination pathway and the slower component with 30.9 ns lifetime is associate with bulk recombination (FIG. 4C). Under power dependent conditions, time-resolved photoluminescence spectra of CsEuCl$_3$ showed fast component lifetimes from 3.5 to 4.26 ns and the slower component lifetimes from 25.8 to 30.8 ns at power densities ranging from 0.0438 to 0.4675 uw/cm$^2$ (FIG. 4D).

Comparatively, rare earth ions can also be doped into the solid matrices (e.g. halides, oxides and sulfides), which has been extensively investigated for optoelectronics, photonics, sensors and biomedicine applications. Solid matrices doped with rare earth ions typically show large Stokes shift and long photoluminescence lifetime. Especially doping a small percentage of rare earth ions into the matrices is favorable formed by solution phase or solid-state methods. Thus, to distinguish the non-perovskites structure of Eu$^{2+}$ doped in CsCl matrix with the CsEuCl$_3$ perovskites of the present technology, Eu$^{2+}$ doped CsCl nanocrystals were synthesized.

Powder X-ray diffraction (XRD) pattern of Eu$^{2+}$ doped CsCl nanocrystals was measured on a Bruker AXS D8 Advance diffractometer with a Co Kα source (X-ray wavelength of 1.79 Å). The transmission electron microscopy (TEM) images were taken on a Hitachi H7650 at an accelerating voltage of 120 kV. High-resolution TEM (HRTEM) images were taken with a FEI Tecnai TEM at an accelerating voltage of 200 kV. The energy-dispersive X-ray spectroscopy (EDS) elemental mapping images were recorded using an FEI Titan microscope operated at 80 kV. This instrument was equipped with an FEI Super-X Quad windowless detector that is based on silicon drift technology. Elemental quantification data was analyzed using the Bruker Esprit EDS analysis package, which has been calibrated against mineral standards for quantitative accuracy.

Figure 8A:
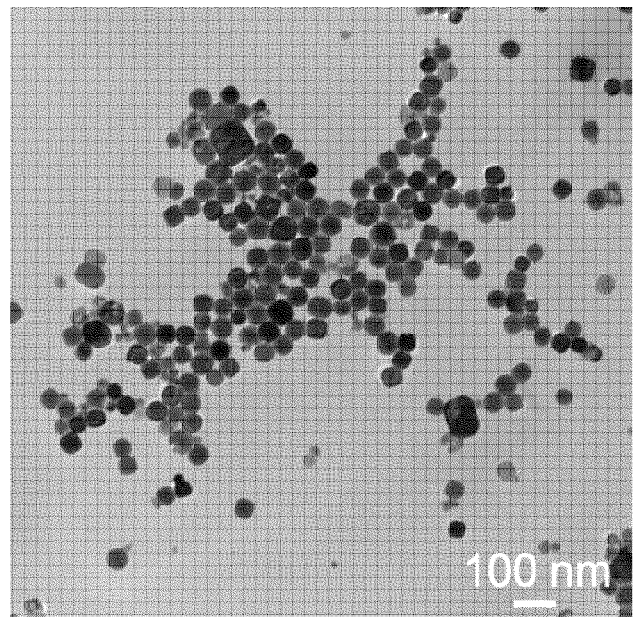
FIG. 8A illustrates a representative TEM image of Eu$^{2+}$ doped CsCl nanocrystals.
Figure 8B:
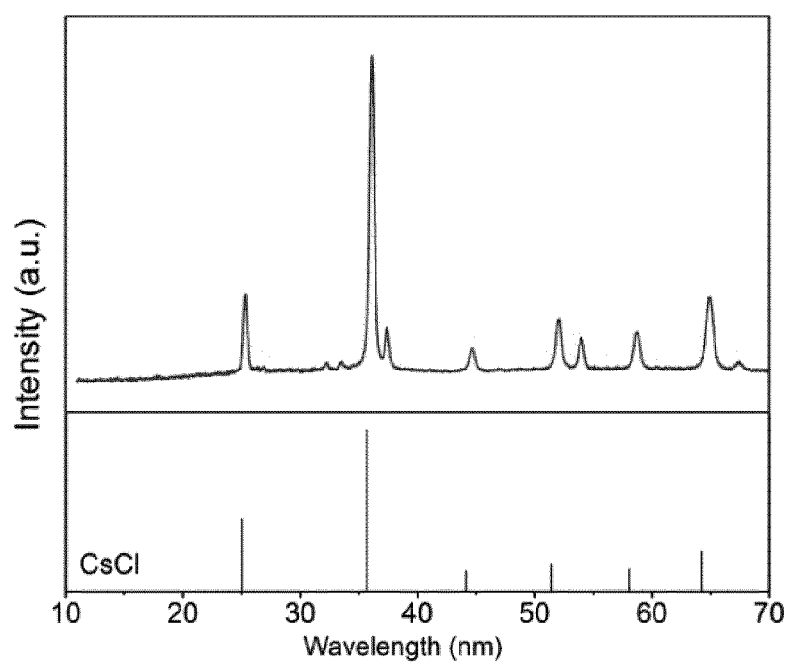
FIG. 8B illustrates a representative XRD pattern of Eu$^{2+}$ doped CsCl nanocrystals (top) and standard XRD pattern of CsCl single crystal (bottom) using a X-ray with wavelength $\lambda=1.79$ Å.
Figure 8C:
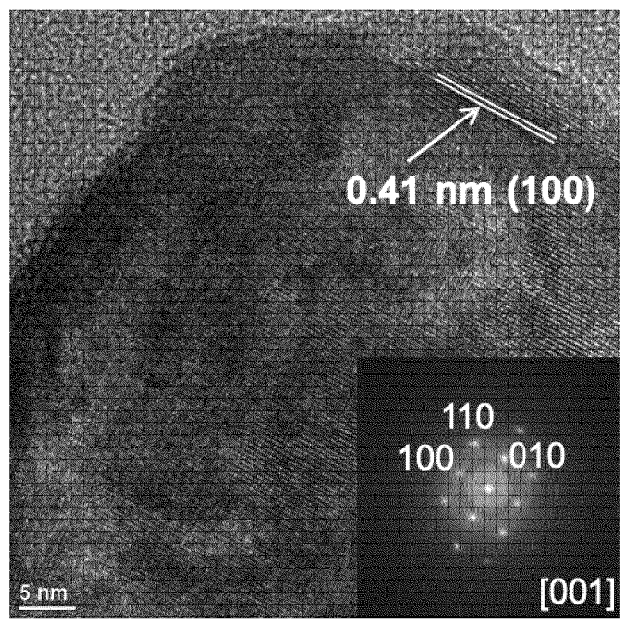
FIG. 8C illustrates a representative HRTEM and corresponding FFT (inset) of Eu$^{2+}$ doped CsCl nanocrystals. X-ray wavelength $\lambda=1.79$ Å.
Figure 9:
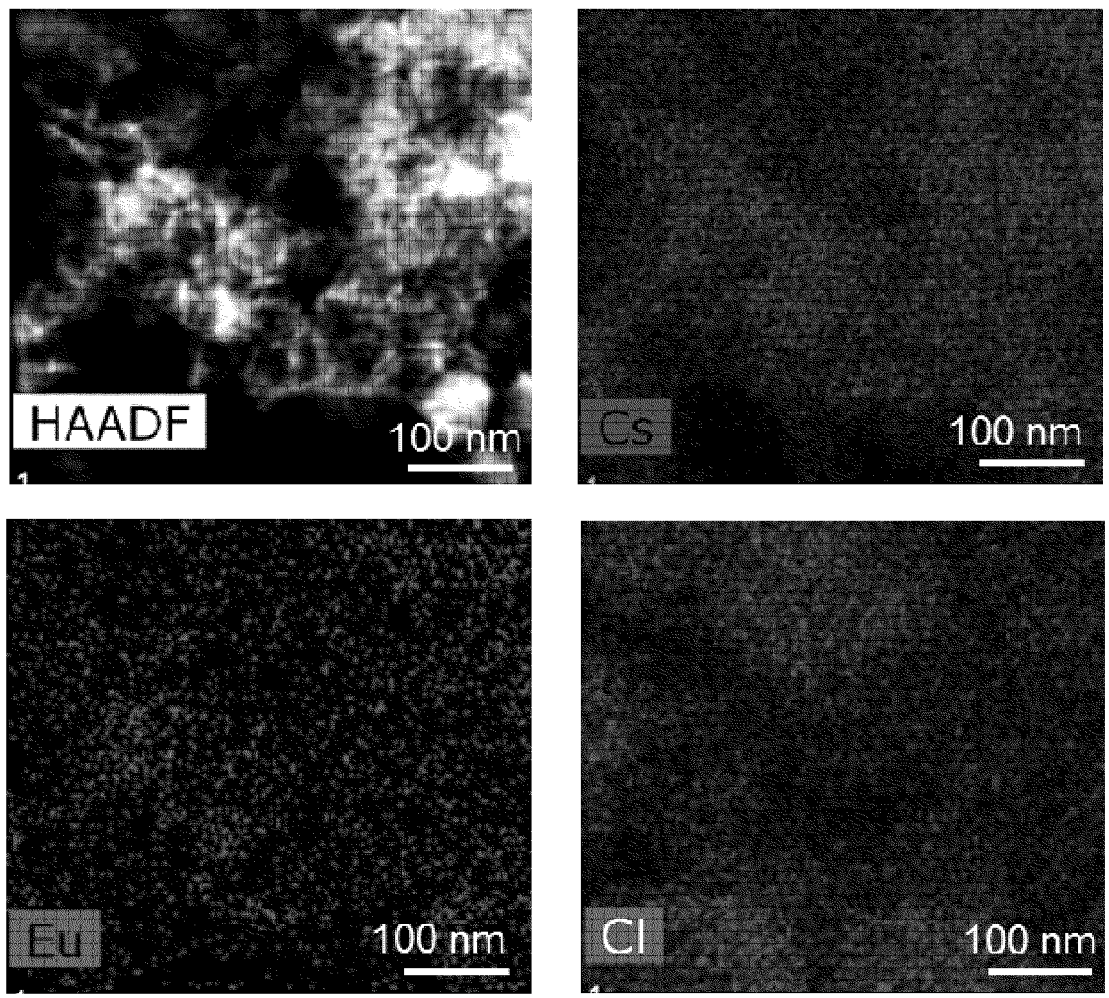
FIG. 9 illustrates an EDS mapping of Eu$^{2+}$ doped CsCl nanocrystals.
Figure 10:
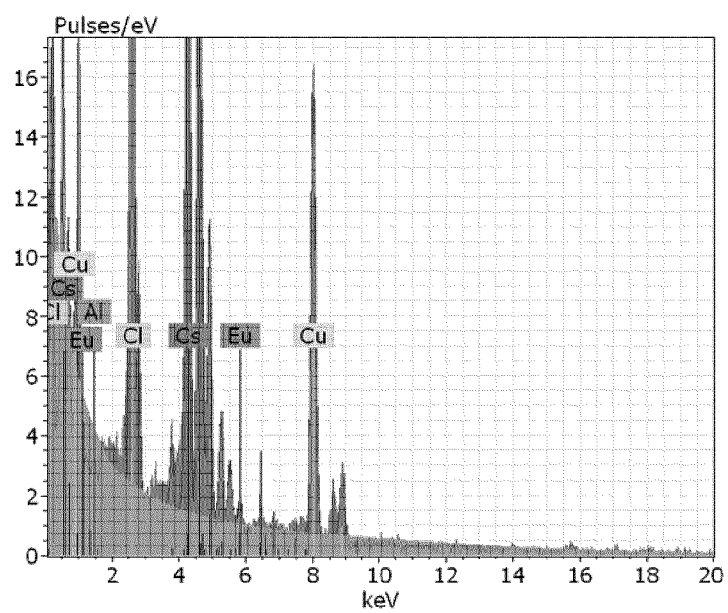
FIG. 10 illustrates an EDS spectrum of Eu$^{2+}$ doped CsCl nanocrystals.

The Eu$^{2+}$ doped CsCl nanocrystals are around 50 nm in diameter (FIG. 8A). The Eu$^{2+}$ doped CsCl structure is confirmed by XRD, which shows a slight shift of the high angle reflections due to the smaller size of the Eu$^{2+}$ cation compared to the Cs$^+$ cation (FIG. 8B). HRTEM shows a lattice constant of 0.41 nm, which is consistent with the (100) plane of CsCl (FIG. 8C). The corresponding Fast Fourier Transform (FFT) from high-resolution TEM reveals the single-crystalline nature of CsCl. Furthermore, EDS mapping clearly show that Eu is homogeneously distributed in the nanocrystals, and EDS quantification indicates a doping level of around 1.3% (FIGS. 9 and 10, Table 2). As shown in Table 2, the doping percentage of Eu reported here is with respect to the total number of atoms, i.e. Cs, Eu, and Cl.

TABLE 2

EDS measured atomic ratio of Eu$^{2+}$ doped CsCl nanocrystals.

| Elements | Measured Atomic % |
|---|---|
| Cs | 41.0 |
| Eu | 1.3 |
| Cl | 57.7 |

Figure 11A:
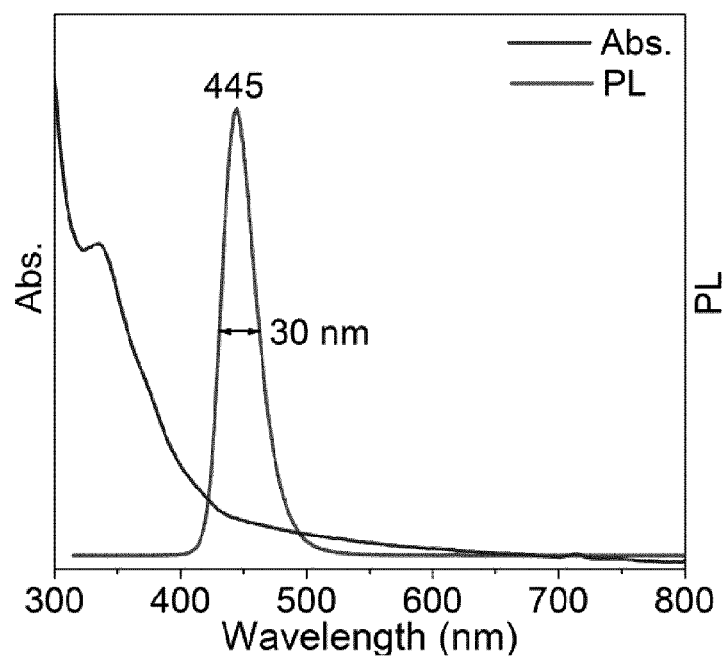
FIG. 11A illustrates an optical absorption and photoluminescence spectra of Eu$^{2+}$ doped CsCl nanocrystals.
Figure 11B:
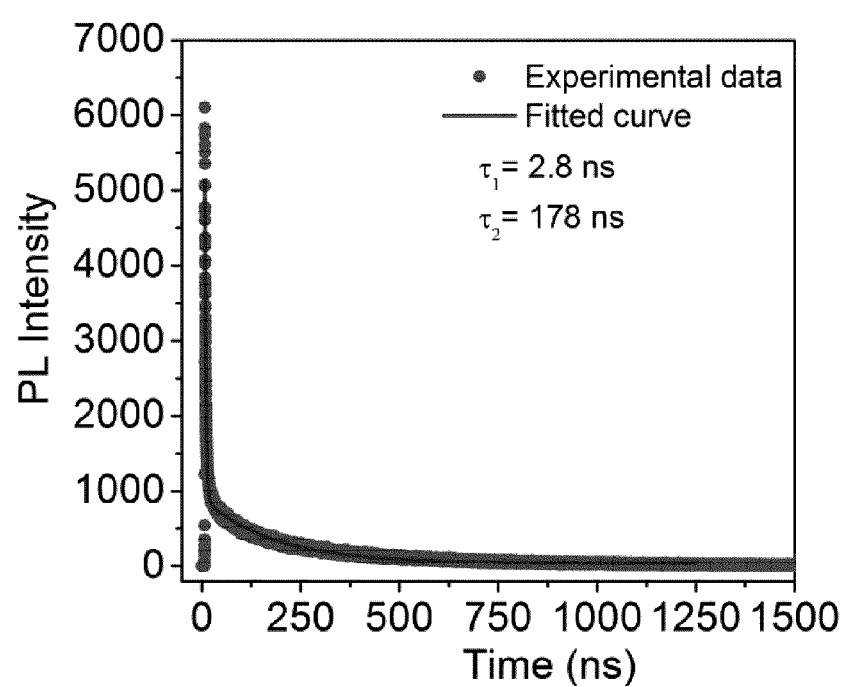
FIG. 11B illustrates a time-resolved photoluminescence spectra of Eu$^{2+}$ doped CsCl nanocrystals, measuring the photoluminescence decay at 445 nm.
Figure 11C:
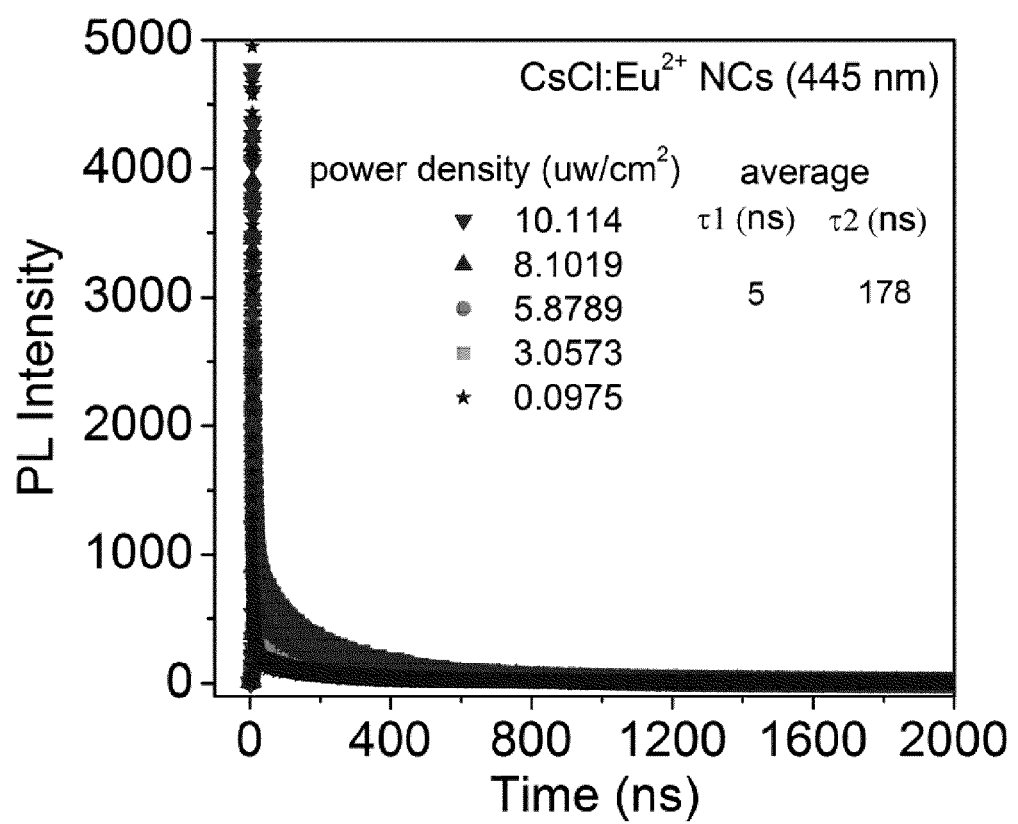
FIG. 11C illustrates a power dependent time-resolved photoluminescence spectra measuring the PL decay at 445 nm for Eu$^{2+}$ doped CsCl.

Unlike the CsEuCl$_3$ perovskite nanocrystals of the present technology, the Eu$^{2+}$ doped CsCl nanocrystals show PL emission centered at 445 nm with a FWHM of 30 nm (FIG. 11A), which originates from the 4f$^6$5 d$^1$-4f$^7$ transition of Eu$^{2+,27}$ leading to a larger FWHM when compared to the band edge emission of CsEuCl$_3$. Eu$^{2+}$ doped CsCl nanocrystals show a longer PL lifetime of 178 ns as compared to that of CsEuCl$_3$ nanocrystals. The Eu$^{2+}$ doped halide or oxide matrices exhibited longer PL lifetime in the range of hundreds of nanoseconds to a few microseconds (FIG. 11B). The long lifetime may be attributed to the electric dipole and magnetic dipole nature of the transitions. Power-dependent TRPL was measured at 445 nm for Eu$^{2+}$ doped CsCl. The PL decay curve shows negligible dependence on the excitation laser power density, affirming the origin of PL emission from the Eu ion instead of a bandgap transition in semiconductor (FIG. 11C).

Example 2. Surface treatment: Anhydrous toluene (5 mL), 1-butyl-4-methylpyridinium chloride (0.05 mmol), OlAc (0.5 mL) and OlAm (0.5 mL) were added to a scintillation vial all within an argon inert atmosphere glovebox. The solution was stirred at 100° C. hot plate within the glovebox until the complete dissolution of the 1-butyl-4-methylpyridinium chloride. The resulting concentrated stock solution is stored in a glovebox to maintain the dryness of the solution over time. The cleaned CsEuCl$_3$ nanocrystals solution was then mixed with the above solution and was stirred at 100° C. hot plate for 1.5 hours.

Figure 6A:
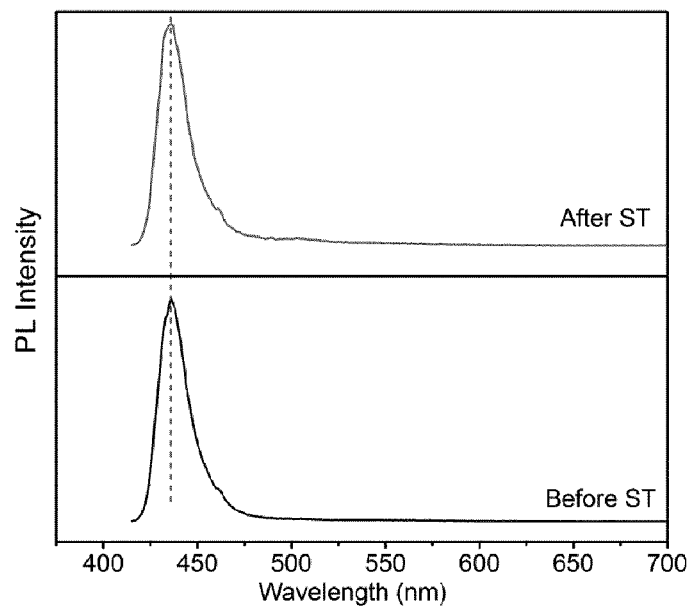
FIG. 6A illustrates a photoluminescence spectra of $CsEuCl_3$ perovskite nanocrystals before and after surface treatment with 1-butyl-4-methylpyridinium chloride.
Figure 6B:
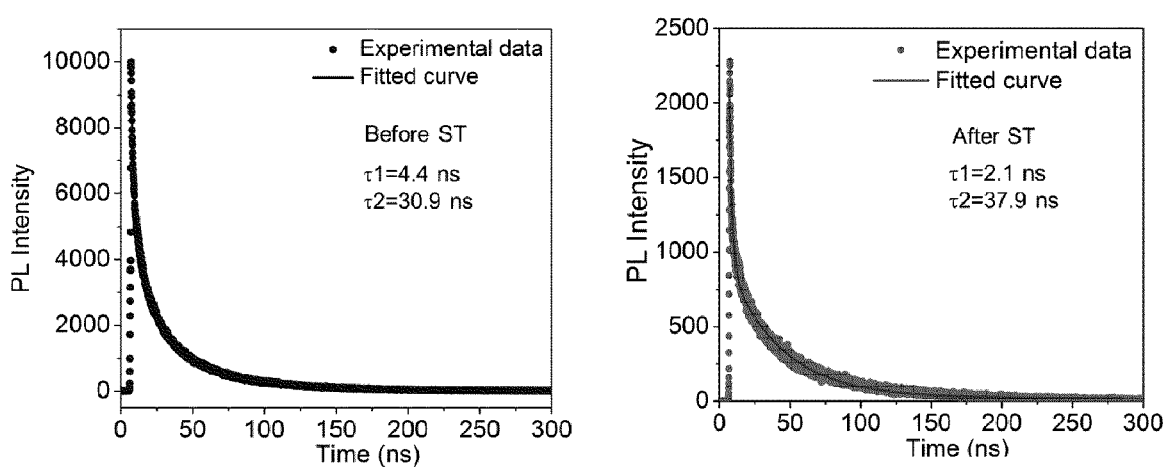
FIG. 6B illustrates a time-resolved photoluminescence spectra of CsEuCl$_3$ perovskite nanocrystals before and after surface treatment with 1-butyl-4-methylpyridinium chloride.

Following surface treatment with 1-butyl-4-methylpyridinium chloride as described above, the CsEuCl$_3$ perovskite nanocrystals exhibited an increased PL quantum efficiency of 5.7%±0.3%. After surface treatment, the PL spectra shows the same peak position (FIG. 6A); however, for the TRPL measurement (FIG. 6B), the ratio of slower component to faster component increases, corresponding to the bulk recombination to surface site non-radiative recombination increases, which indicates that the surface site defects become less, consistent with the enhancement of photoluminescence quantum yield (PLQY). Without being bound by theory, it is believed that this may be due to the ionic ligand providing a chlorine source to substitute the chloride vacancy (Cl$_v$) in the nanocrystal surface (FIG. 7).

Example 3. CsEuCl$_3$ nanocrystals embedded in matrix: PMMA was dissolved well in toluene. Then, CsEuCl$_3$ nanocrystals solution was added into this PMMA solution. Sonication was applied to create a homogeneous solution. The obtained solution was spin-coated or drop-casted to achieve a transparent thin film.

Figure 5A:
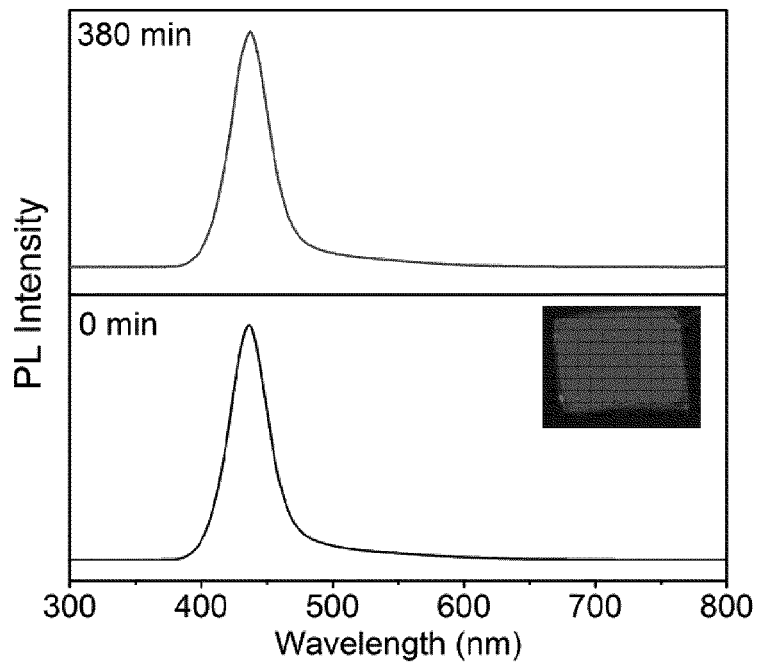
FIG. 5A illustrates a photoluminescence spectra of measurement before and after 380 min of continuous laser irradiation on $CsEuCl_3$ perovskite nanocrystals embedded in poly(methylmethacrylate) (PMMA). The inset picture shows the $CsEuCl_3$ perovskite nanocrystals-PMMA thin film under 365 nm UV lamp.
Figure 5B:
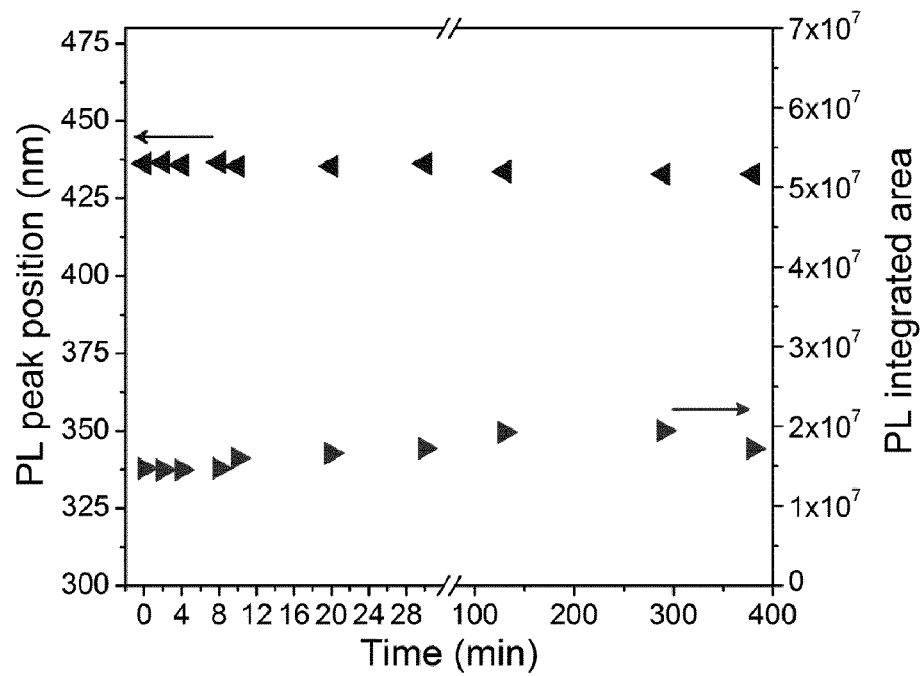
FIG. 5B illustrates an emission peak position and integrated intensity during 380 min of continuous laser irradiation of $CsEuCl_3$ perovskite nanocrystals.
Figure 12:
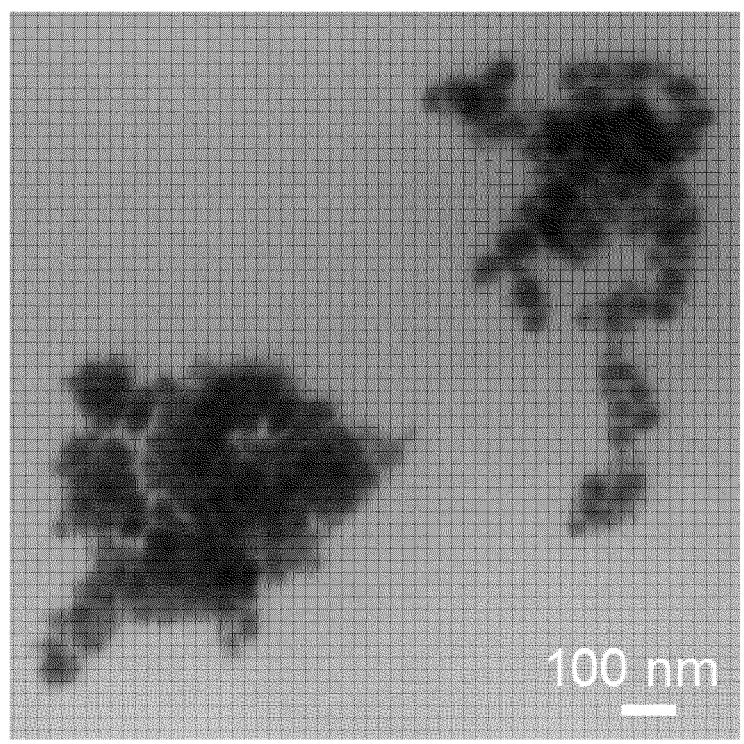
FIG. 12 illustrates a TEM image of the CsEuCl$_3$ nanocrystals embedded in PMMA.
Figure 13:
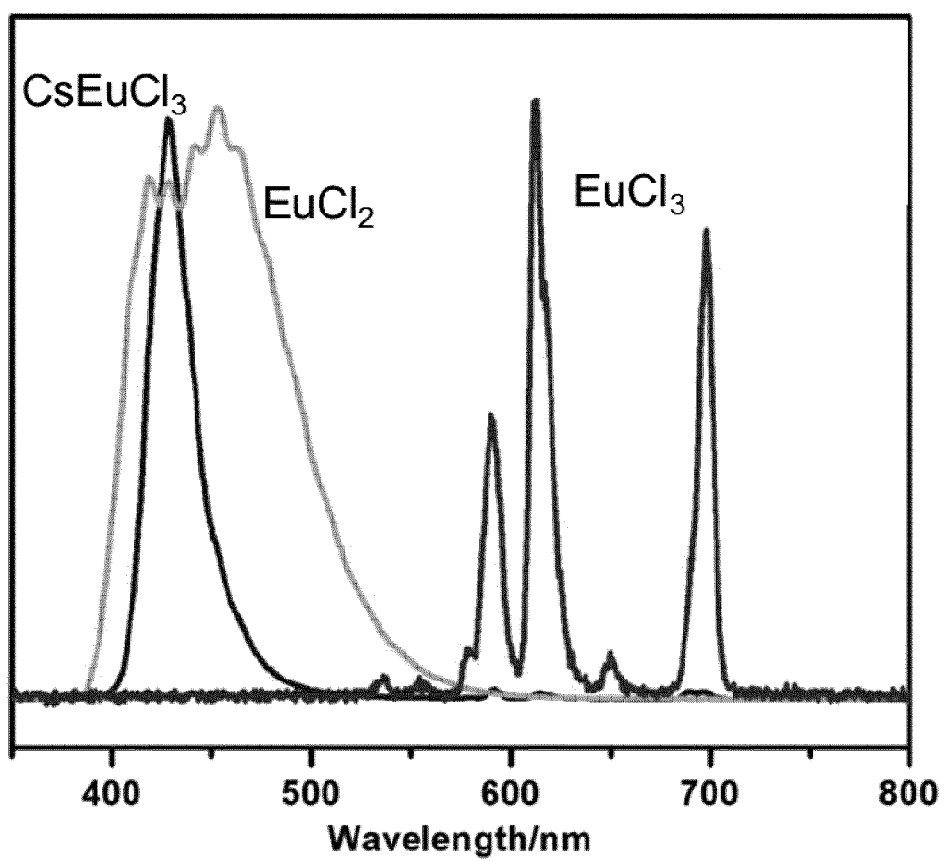
FIG. 13 illustrates a photoluminescence spectra of CsEuCl$_3$ single crystal, precursors of EuCl$_2$ and EuCl$_3$.

For the CsEuCl$_3$ perovskite nanocrystals embedded in PMMA, the thin film sample was excited by a continuous-wave solid-state laser at 375 nm (Coherent OBIS 375LX) with a laser filter (bandpass, 375 nm/6 nm). The PMMA matrix causes a lower contrast in the TEM images due to lack of diffraction (FIG. 12), however it offers important protection of nanocrystals against moisture. The encapsulated nanocrystals show excellent optical stability under a continuous laser irradiation. The PL peak position and intensity changed negligibly during 380-min of irradiation measurements on the encapsulated nanocrystals (FIGS. 5A and 5B). Furthermore, there was no red emission detected from the $Eu^{3+}$ ion, which peaks position are observable at 593 nm, 613 nm, 650 nm and 698 nm (FIG. 13). PMMA can thus effectively stabilize the $CsEuCl_3$ perovskite nanocrystals.

Thus, the process of the present technology, as demonstrated by the examples described herein, provide a colloidal solution phase synthetic approach developed to obtain single-crystalline rare earth metal perovskite nanocrystals (e.g., $CsEuCl_3$) with uniform size centered around 15 nm. As described above, the rare earth metal perovskite nanocrystals obtained according to the present technology exhibit a sharp emission peak at 435 nm with narrow FWHM of 19 nm. The rare earth metal perovskite nanocrystals embedded in PMMA matrix show good stability under continuous laser irradiation. As illustrated in the examples described herein, $CsEuCl_3$ perovskite nanocrystals provide a promising candidate to replace lead halide perovskites. Additionally, encapsulating these nanocrystals in a PMMA matrix provides enhanced stability towards radiation and heat.

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions, or biological systems, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed is:

1. A solution phase synthesis process for preparing a rare earth perovskite, the process comprising:
   reacting an alkali metal material with a first surfactant ligand in the presence of a first solvent to obtain a first precursor complex solution;
   reacting a rare earth metal halide with a second surfactant ligand in the presence of a second solvent to obtain a second precursor complex solution; and
   reacting the first precursor complex solution with the second precursor complex solution in the presence of a third surfactant ligand and a third solvent to obtain the rare earth perovskite;
   wherein:
   the rare earth perovskite is in the form of nanocrystals; and
   the first solvent and third solvent each comprise a non-coordinating solvent.

2. The process of claim 1, wherein the alkali metal material is an alkali metal carbonate, an alkali metal acetate, or a combination thereof.

3. The process of claim 1, wherein the first surfactant ligand, the second surfactant ligand, and the third surfactant ligand are each independently oleic acid, oleyl amine, trioctyl phosphine, dodecanoic acid, octanoic acid, heptadecanoic acid, triphenylphosphine, or a combination of two or more thereof.

4. The process of claim 1, wherein the first precursor complex solution comprises a complex of a cation of the alkali metal material and an anion of the first surfactant ligand.

5. The process of claim 1, wherein the rare earth metal halide comprises a rare earth metal that is cerium, erbium, europium, gadolinium, holmium, lanthanum, lutetium, neodymium, promethium, samarium, terbium, thulium, ytterbium, or a mixture of any two or more thereof.

6. The process of claim 1, wherein the second precursor complex solution comprises a rare earth metal complex having a formula: $EX_2$-LX, wherein E is a rare earth metal, L is the second surfactant ligand, and X is F, Cl, Br, or I.

7. The process of claim 1, wherein the rare earth perovskite has the formula: $MEX_3$, wherein M is an alkali metal, E is a rare earth metal, and X is F, Cl, Br, or I.

8. The process of claim 1, wherein the non-coordinating solvent is octadecene, octadecane, hexadecane, or a combination of two or more thereof.

9. The process of claim 1, further comprising the step of surface treating the rare earth perovskite.

10. The process of claim 9, wherein the step of surface treating comprises combining the rare earth perovskite with a halide-providing compound.

11. The process of claim 10, wherein the halide-providing compound is a quaternary ammonium halide compound, a benzoyl halide, a pyridinium halide, or combination of two or more thereof.

12. The process of claim 1, further comprising the step of encapsulating the rare earth perovskite in a polymer.

13. The process of claim 12, wherein the polymer is poly(methylmethacrylate), poly(styrene-ethylene-butylene-styrene), poly(lauryl methacrylate), poly(acrylic acid), or a combination of two or more thereof.

14. The process of claim 1, wherein the nanocrystals have a uniform size distribution from about 5 nm to about 50 nm.

15. The process of claim 1, wherein the rare-earth perovskite is in the form of single-crystalline nanocrystals.

* * * * *